United States Patent [19]

Tobita

[11] Patent Number: 4,695,746
[45] Date of Patent: Sep. 22, 1987

[54] SUBSTRATE POTENTIAL GENERATING CIRCUIT

[75] Inventor: Youichi Tobita, Hyogo, Japan

[73] Assignee: Mitsubishi Denki Kabushiki Kaisha, Tokyo, Japan

[21] Appl. No.: 763,588

[22] Filed: Aug. 8, 1985

[30] Foreign Application Priority Data

Oct. 19, 1984 [JP] Japan .................................. 59-220906

[51] Int. Cl.[4] ........................ H01L 27/10; H03L 1/00; H03K 3/354
[52] U.S. Cl. ..................................... 307/297; 307/304; 307/296 R; 357/23.6
[58] Field of Search ............... 307/296 R, 297, 296 A, 307/304; 357/23.6

[56] References Cited

U.S. PATENT DOCUMENTS

| | | | |
|---|---|---|---|
| 4,430,581 | 2/1984 | Mogi et al. | 307/297 X |
| 4,455,628 | 6/1984 | Ozaki et al. | 307/296 R X |
| 4,494,223 | 1/1985 | Reddy et al. | 307/297 X |
| 4,553,047 | 11/1985 | Dillinger et al. | 307/297 |
| 4,581,546 | 4/1986 | Allan | 307/296 R X |
| 4,585,954 | 4/1986 | Hashimoto et al. | 307/296 R |
| 4,628,215 | 12/1986 | Lou | 307/296 A X |

*Primary Examiner*—Stanley D. Miller
*Assistant Examiner*—David R. Bertleson
*Attorney, Agent, or Firm*—Sughrue, Mion, Zinn, Macpeak & Seas

[57] ABSTRACT

A substrate potential generating circuit for a semiconductor integrated circuit in which, in addition to a conventional circuit for supplying a bias current to the substrate, at least two additional bias current supplying circuits are provided. With this configuration, when the substrate potential reaches its final level, the substrate bias current from the conventional circuit is interrupted to reduce the power consumption of the integrated circuit.

12 Claims, 4 Drawing Figures

SUBSTRATE POTENTIAL GENERATING CIRCUIT

BACKGROUND OF THE INVENTION

The present invention relates to a substrate potential generating circuit in a semiconductor integrated circuit which employs MOS IGFETs (metal-oxide-semiconductor insulated-gate field-effect transistors).

In an integrated circuit using MOS transistors, especially in a dynamic RAM (random access memory), bias is generally applied to the semiconductor substrate in order to speed up the operation of the circuit. In general, this bias is a voltage generated by a substrate potential generating circuit provided on the chip.

A conventional substrate potential generating circuit of this type is shown in FIG. 1. In this figure, reference numeral 1 designates a pulse generating circuit using a ring oscillator; 2, a power source terminal for the pulse generating circuit; 3, the output terminal of the pulse generating circuit 1; 4, a coupling capacitor; 5, a node; and 6, a rectifying MOS transistor connected between the mode 5 and ground. The gate electrode of the MOS transistor 6 is connected to the node 5, and the node side serves as an anode. Further in FIG. 1, reference numeral 7 designates a rectifying MOS transistor connected between the node 5 and a substrate potentail generating terminal (output terminal) 9. The gate electrode of the transistor 7 is connected to the output terminal 9, and the output terminal side serves as an anode. The output terminal 9 is grounded through a capcitor 8 used to stabilize the substrate potential. The above-described circuit elements 4 through 7 form the substrate potential generating circuit.

The operation of the circuit of FIG. 1 will be described with reference to the waveform diagram of FIG. 2.

The power source terminal 2 of the pulse generating circuit 1 is connected to the power source terminal of the integrated circuit. Therfore, when a supply voltage $V_{cc}$ is applied to the integrated circuit, the voltage $V_2$ at the terminal 2 is increased to the value $V_{cc}$ immediately; however, the voltage $V_9$ at the output terminal 9 reaches a final level $V_{SUB}$ only after a delay time ($t_0 - t_1$). For practical use, it has been required that the delay time is set to 100 microseconds or less in most cases.

In order to meet this requirement, the manufacturer determines parameters for the various elements as follows:

In order to generate a substrate bias, a pulse having an amplitude $V_{cc}$ is applied to one terminal of the coupling capacitor, or the output terminal 3 of the pulse generating circuit 1, so that a bias current is caused to flow through the coupling capacitor 4. The capacitor 8 connected to the output terminal 9 is gradually charged by this current. The final level $V_{SUB}$ of the voltage provided at the output terminal 9 can be represented by the following equation which is well known in the art:

$$V_{SUB} = -(V_{cc} - 2V_{TH}), \quad (1)$$

where $V_{TH}$ is the threshold of each of the MOS transistor 8 is:

$$Q_8 = -(V_{cc} - 2V_{TH})C_8, \quad (2)$$

where $C_8$ is the stabilizing capacitance.

In many cases, $V_{cc} = 5$ V, $V_{TH} = 0.5$ V, and $C_8 = 1000$ Pf. Therefore, $$Q_8 = -(5 - 1.0)1000 = -4000(pQ).$$

Hence, the substrate bias current required for storing the above-described charge in the capacitor in 100 microseconds is:

$$I = 4000pQ/100 \text{ microseconds} = 40 \text{ microamperes}. \quad (3)$$

That is, the frequency of the pulse generating circuit 1 and the capacitance of the coupling capacitor 4 are determined so that the pulse generating curcuit 1 supplies a current of 40 microamperes through the coupling capacitor to the capacitor 8.

The above-described substrate bias current is necessary in order to stabilize the substrate potential within a predetermined period of time after the application of the supply voltage $V_{cc}$. In addition, the substrate bias current serves to compensate for an impact ionization current which, when the integrated circuit performs a reading or writing operation after the substrate potential has been stabilized, is caused by holes near the drain of the MOS transistor. On the other hand, when the integrated circuit is not in operation, that is, when it is in the standby state, only the reverse leakage current at the P-N junction flows. This current is, in general, on the order of several 10s of picoamperes to about 100 picoamperes. Therefore, it is unnecessary to supply a current as large as 40 microamperes.

A large number of dynamic RAMs are usually employed in a memory system. However, only a fraction of them are in operation at any one time, the remaining dynamic RAMs being in the standby state. This means that the substrate bias current is used uneconomically.

SUMMARY OF THE INVENTION

Accordingly, an object of the invention is to eliminate the above-described difficulty accompanying a conventional substrate potential generating circuit. More specifically, an object of the invention is to provide a substrate potential generating circuit in which, after the substrate current has reached a final level, the flow of substrate bias current is interrupted.

The foregoing object and other objects of the invention have been achieved by the provision of a substrate potential generating circuit for a semiconductor integrated circuit employing MOS transistors as its fundamental elements, which, according to the invention, comprises: first circuit means receiving through a first capacitive element a pulse signal from a pulse generating circuit operated from a supply voltage and supplying a first substrate bias current to an output terminal at all times after application of the supply voltage; and second circuit means receiving through a second capacitive element the pulse signal from the pulse generating circuit and supplying a second substrate bias current to the output terminal for a predetermined period of time after application of the supply voltage; and/or a third circuit receiving through a fourth capacitive element a pulse signal which is produced only when the semiconductor integrated circuit performs an active operation such as a reading, writing or refreshing operation, and supplying a third substrate bias current to the output terminal only when the pulse signal is received.

The nature, principle and utility of the invention will become more apparent from the following detailed description when read in conjunction with the accompanying drawings.

BRIEF DESCRIPTION OF THE DRAWINGS

In these figures, like parts are designated by like reference numerals or characters.

DESCRIPTION OF THE PREFERRED EMBODIMENTS

Figure 3:
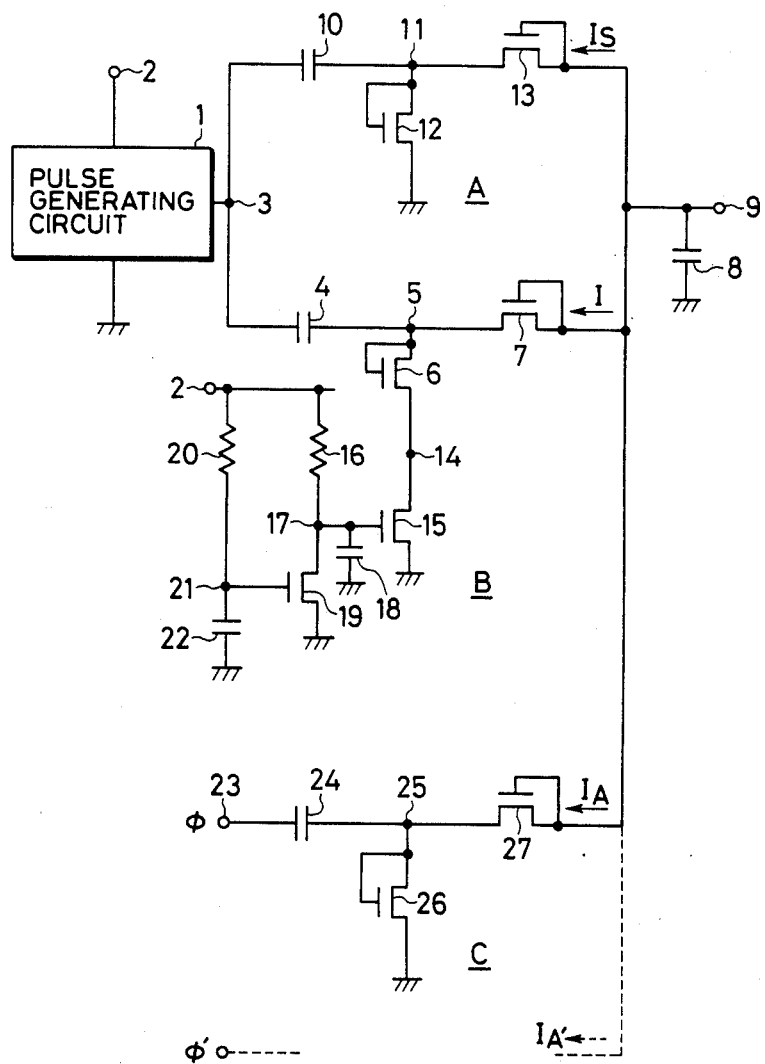
FIG. 3 is a circuit diagram showing an example of a substrate potential generating circuit constructed according to the invention.

A substrate potential generating circuit according to the invention will be described with reference to FIG. 3. In FIG. 3, those components which have been described with reference to FIG. 1 are therefore designated by the same reference numerals.

Figure 1:
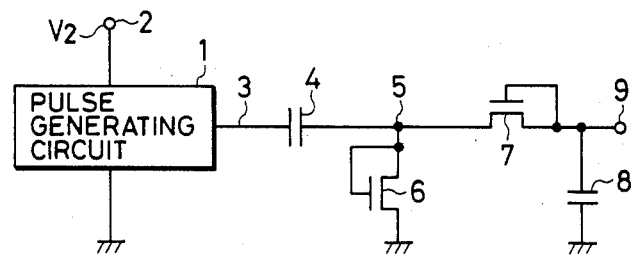
FIG. 1 is a circuit diagram showing a conventional substrate potential generating circuit.
Figure 2:
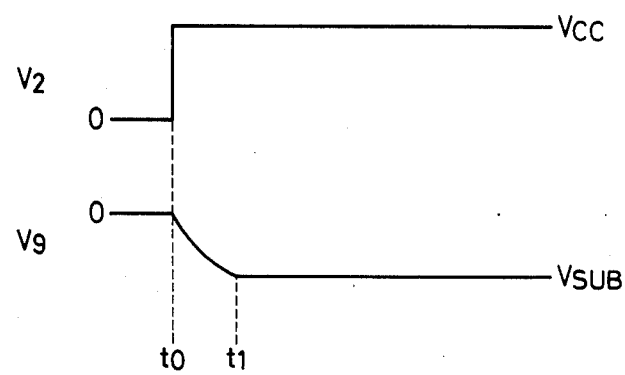
FIG. 2 is a timing chart showing a substrate potential waveform in the circuit of FIG. 1 when a supply voltage is applied thereto.

In FIG. 3, reference numerals 10, 11, 12 and 13 designate a coupling capacitor, a node and two MOS transistors, respectively, which are arranged in the same manner as the circuit elements 4, 5, 6 and 7 in FIG. 1, and reference numerals 24, 25, 26 and 27 also designate a coupling capacitor, a node and two further MOS transistors, respectively, which are arranged in the same manner as the circuit elements 4, 5, 6 and 7. The circuit elements 10 through 13 form a first circuit A, the circuit elements 4 through 7 and circuit elements 14 through 22 form a second circuit B, and the circuit elements 24 through 27 form a third circuit C. Further in FIG. 3, reference numeral 23 designates a terminal to which a pulse signal $\phi$ is applied. The pulse signal $\phi$ is generated by a circuit (provided on the integrated circuit) in response to a signal applied through the external terminal of the chip. The pulse signal $\phi$ is in the form of pulse train when the chip perform a reading, writing or refreshing operation, and it is maintained at a fixed level when the chip is in the standby state.

Further in FIG. 3, reference numeral 14 designates a MOS transistor connected between the rectifying MOS transistor 6 and ground; 14, the node of the MOS transistors 6 and 15; 16, a resistor connected between the gate electrode of the MOS transistor 15 and the power source terminal 2; 17, the node of the MOS transistor 15 and the resistor 16; 18, the parasitic capacitance of the node 17; 19, a MOS transistor connected between the node 17 and ground; 20, a resistor connected between the power source terminal 2 and the MOS transistor 19; 21, the node of the MOS transistor 19 and the resistor 201; and 22, a capacitor connected between the node 21 and ground.

Figure 4:
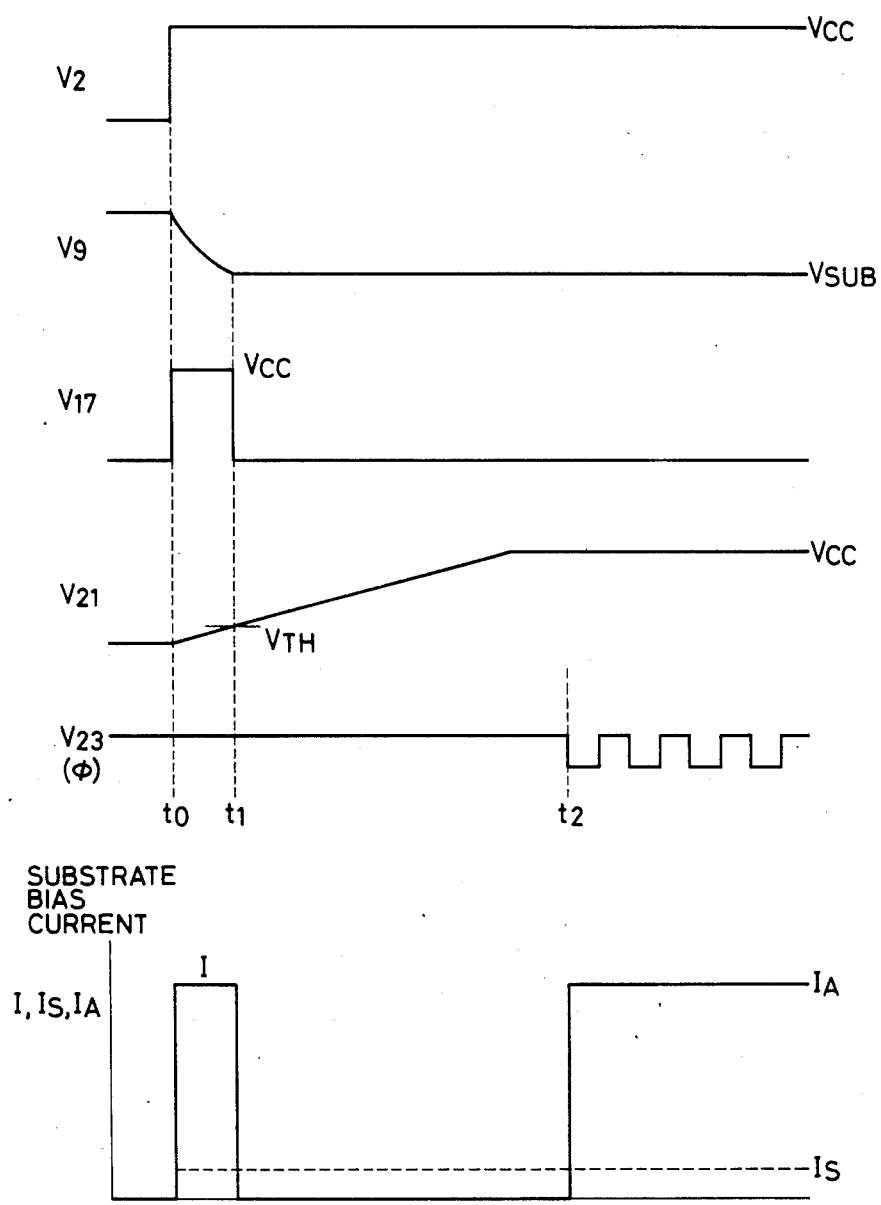
FIG. 4 is a timing chart showing voltage and current waveforms at various circuit points in the circuit of FIG. 3 when a supply voltage is applied thereto.

The operation of the circuit shown in FIG. 3 will be described with reference to the waveform diagram of FIG. 4.

When a supply voltage $V_{cc}$ is applied at the time instant $t_0$, the voltage at the terminal 2 is immediately raised to the supply voltage $V_{cc}$. As a result, the pulse generating circuit 1 is operated to supply a pulse to its output terminal 3, whereby the first circuit A is operated and a substrate bias current $I_S$ flows. The substrate bias current $I_S$ can be represented by the following expression:

$$I_S = f \cdot C_{10} \cdot (V_{cc} - V_{TH}),\qquad(4)$$

where f is the frequency of the pulses provided by the pulse generating circuit 1, $C_{10}$ is the capacitance of the coupling capacitor 10, and $V_{TH}$ is the threshold voltage of the MOS transistor 12.

As is apparent from expression (4), the substrate bias current $I_S$ can be changed by adjusting the capacitance $C_{10}$. The coupling capacitor 10 is formed of a thin insulating film having a thickness of the order of several hundred Angstroms and electrodes of polysilicon laid on both sides of the insulating film. The capacitance $C_{10}$ of the coupling capacitor can be readily adjusted by changing the areas of the electrodes or the thickness of the insulating film.

In the circuit in FIG. 3, a capacitance is selected which corresponds to the magnitude of current necessary for compensating the leakage current at the P-N junction. On the other hand, the second circuit B supplies a substrate bias current I only when the supply voltage $V_{cc}$ is applied thereto. In the second circuit B, before application of the supply voltage $V_{cc}$, the nodes 17 and 21 are at the "0" level (low logic level), and the MOS transistors 15 and 19 are then nonconductive (off). The voltages at the nodes 17 and 21 are raised toward the "1" level (high logic level); however, since the parasitic capacitor 18 is smaller in capacitance than the capacitor 22, the voltage at the node 17 is raised to the "1" level earlier than the voltage at the node 21 (the capacitor 18 is charged up earlier than the capacitor 22). The charging speed is substantially equal to the speed of application of the supply voltage.

For instance, if the resistance $R_{16}$ of the resistor 16 is 5 megohms and the capacitance $C_{18}$ of the parasitic capacitor 18 is 0.5 pF, the charging time constant 17 of the node 17 is:

$$\tau_{17} = 5 \times 10^6 \times 0.5 \times 10^{-12} = 25 \text{ microseconds.}$$

When the capacitor 18 is charged (at a rate determined by the time constant $\tau_{17}$), the MOS transistor 15 is rendered conductive (on), as a result of which the second circuit B is operated and the substrate bias current I flows. On the other hand, for the node 21, the time constant is larger, and therefore the charging speed of the capacitor 22 is lower. For instance, if the resistance $R_{20}$ of the resistor 20 is 5 megohms and the capacitance $C_{22}$ of the capacitor 22 is 100 pF, the charging time constant $\tau_{21}$ of the node 21 is:

$$\tau_{21} = 5 \times 10^6 \times 100 \times 10^{-12} = 500 \text{ microseconds.}$$

Because the charging time constant 21 is large, the charging speed at the node 21 is low. Accordingly, when the substrate is substantially charged up by the substrate bias current I (at the time instant $t_1$), the MOS transistor 19 is rendered conductive (on) while the MOS transistor 15 is rendered nonconductive (off) so that the operation of the second circuit B is stopped. Thus, only the charging current $I_S$ is applied to the substrate, which contributes to the economical use of electric power.

The steady-state current $I_{15}$ of the MOS transistor 15 which flows when it is rendered conductive is very small:

$I_{15} = V_{cc}/R_{16} = 5$ V/5 megohms = 1 microampere.

The third circuit C is provided to compensate for the impact ionization current which flows in the substrate when the chip performs an active operation such as reading. In order to operate the chip, a pulse signal $\phi$ is applied thereto. Therefore, the pulse signal $\phi$ causes a necessary current $I_4$ to flow in the circuit C to complement the reduction of substrate potential. In the case where a plurality of pulses are used for activating the chip, the number of substrate bias current supplying circuits should be increased according to the number of pulses applied, as indicated by broken lines in FIG. 3.

As is apparent from the above description, the substrate potential generating circuit of the invention has first, second and third circuits which supply different bias currents to the substrate separately in response to the supply voltage being applied to the chip, the chip being placed in operation, and the chip being placed in the standby state. That is, the substrate bias current is set according to the operational state of the chip. Thus, the substrate bias current can be reduced during standby times, which contributes to a reduction of the power consumption of the integrated circuit.

I claim:

1. A substrate potential generating circuit for a semiconductor integrated circuit employing insulated-gate field-effect transistors as fundamental elements, in which said semiconductor integrated circuit comprises:
   first circuit means receiving through a first capacitive element a pulse signal from a pulse generating circuit operated from a supply voltage for supplying a first substrate bias current to an output terminal at all times after application of said supply voltage; and
   second circuit means receiving through a second capacitive element said pulse signal from said pulse generating circuit for supplying a second substrate bias current to said output terminal for a predetermined period of time after application of said supply voltage;
   said first circuit means comprises: a first rectifying MOS transistor connected between one electrode of said first capacitive element and said output terminal; and a second rectifying MOS transistor connected between said one electrode of said first capacitive element and ground, and
   said second circuit means comprises: a third rectifying MOS transistor connected between one electrode of said second capacitive element and said output terminal; a fourth rectifying MOS transistor having one main electrode connected to said one electrode of said second capacitive element; a controlling MOS transistor connected between another main electrode of said fourth rectifying MOS transistor and ground; and an "on" signal generating circuit means for applying an "on" signal to a gate electrode of said controlling MOS transistor for a predetermined period of time after application of said supply voltage to render said controlling MOS transistor conductive.

2. The substrate potential generating circuit as claimed in claim 1, in which said first substrate bias current provided by said first circuit means is set to compensate for a leakage current at a P-N junction of said integrated circuit.

3. The substrate potential generating circuit as claimed in claim 1, in which said "on" signal generating circuit means comprises:
   a first load element connected between a first node and a power source node to which said supply voltage is applied;
   a third capacitive element connected between said first node and ground;
   a second load element connected between said power source node and a second node which is connected to said controlling MOS transistor; and
   a MOS transistor connected between said second node and ground and having a gate electrode connected to said first node.

4. The substrate potential generating circuit as claimed in claim 3, in which a capacitance of said third capacitive element is larger than a capacitance of a parasitic capacitor at said gate electrode of said controlling MOS transistor.

5. A substrate potential generating circuit for a semiconductor integrating circuit employing insulated-gate field-effect transistors as fundamental elements, in which said substrate potential generating circuit comprises:
   first circuit means receiving through a first capacitive element a pulse signal from a pulse generating circuit operated from a supply voltage for supplying a first substrate bias current to an output terminal at all times after application of said supply voltage;
   second circuit means receiving through a second capacitive element said pulse signal from said pulse generating circuit for supplying a second substrate bias current to said output terminal for a predetermined period of time after application of said supply voltage;
   a third circuit means receiving through a further capacitive element a pulse signal which is produced only when said semiconductor integrated circuit performs an active operation, including reading, writing and refreshing operations, for supplying a third substrate bias current to said output terminal only when said pulse signal is received;
   said second circuit means comprises: a first rectifying MOS transistor connected between one electrode of said second capacitive element and said output terminal; a second rectifying MOS transistor having one main electrode connected to said one electrode of said second capacitive element; a controlling MOS transistor connected between another main electrode of said second rectifying MOS transistor and ground; and an "on" signal generating circuit means for applying an "on" signal to a gate electrode of said controlling MOS transistor for a predetermined period of time after application of said supply voltage to render said controlling MOS transistor conductive; and
   said third circuit means comprises: a third rectifying MOS transistor connected between one electrode of said further capacitive element and said output terminal; and a fourth rectifying MOS transistor connected between said one electrode of said further capacitive element and ground.

6. The substrate potential generating circuit as claimed in claim 5, in which said first substrate bias current provided by said first circuit means is set to compensate for a leakage current at a P-N junction of said integrated circuit.

7. The substrate potential generating circuit as claimed in claim 5, in which said "on" signal generating circuit means comprises:
- a first load element connected between a first node and a power source node to which said supply voltage is applied;
- a second load element connected between said power source node and a second node which is connected to said controlling MOS transistor; and
- a MOS transistor connected between said second node and ground and having a gate electrode connected to said first node.

8. The substrate potential generating circuit as claimed in claim 7, in which a capacitance of said third capacitive element is larger than a capacitance of a parasitic capacitor at said gate electrode of said controlling MOS transistor.

9. The substrate potential generating circuit as claimed in claim 5, in which said first substrate bias current is smaller than each of said second and third substrate bias currents.

10. A substrate potential generating circuit for a semiconductor integrating circuit employing insulated-gate field-effect transistors as fundamental elements, in which said substrate potential generating circuit comprises:
- first circuit means receiving through a first capacitive element a pulse signal from a pulse generating circuit operated from a supply voltage for supplying a first substrate bias current to an output terminal at all times after application of said supply voltage; and
- second circuit means receiving through a second capacitive element said pulse signal from said pulse generating circuit for supplying a second substrate bias current to said output terminal for a predetermined period of time after application of said supply voltage;
- a further circuit means receiving through a further capacitive element a pulse signal which is produced only when said semiconductor integrated circuit performs an active operation, including reading, writing and refreshing operations, to supply a further substrate bias current to said output terminal only when said pulse signal is received;
- said first circuit means comprises; a first rectifying MOS transistor connected between one electrode of said first capacitive element and said output terminal; a second rectifying MOS transistor connected between said one electrode of said first capacitive element and ground,
- said second circuit means comprises: a first rectifying MOS transistor connected between one electrode of said second capacitive element and said output terminal; a second rectifying MOS transistor having one main electrode connected to said one electrode of said second capacitive element; a controlling MOS transistor connected between another main electrode of said second rectifying MOS transistor and ground; and an "on" signal generating circuit means for applying an "on" signal to a gate electrode of said controlling MOS transistor for a predetermined period of time after application of said supply voltage to render said controlling MOS transistor conductive; and
- said further circuit means comprises: a further rectifying MOS transistor connected between one electrode of said further capactive element and said output terminal; and a still further rectifying MOS transistor connected between said one electrode of said further capacitive element and ground.

11. The substrate potential generating circuit as claimed in claim 10, in which said first substrate bias current provided by said first circuit is set to compensate for a leakage current at a P-N junction of said integrated circuit.

12. The substrate potential generating circuit as claimed in claim 10, in which said first substrate bias current is smaller than said further substrate bias current.

* * * * *